(12) United States Patent
Sato

(10) Patent No.: US 12,436,474 B2
(45) Date of Patent: Oct. 7, 2025

(54) LITHOGRAPHY DEVICE, LITHOGRAPHY METHOD, AND ARTICLE MANUFACTURING METHOD

(71) Applicant: CANON KABUSHIKI KAISHA, Tokyo (JP)

(72) Inventor: Kazuhiro Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 87 days.

(21) Appl. No.: 18/299,892

(22) Filed: Apr. 13, 2023

(65) Prior Publication Data

US 2023/0350313 A1 Nov. 2, 2023

(30) Foreign Application Priority Data

Apr. 27, 2022 (JP) ................................. 2022-072974

(51) Int. Cl.
 - *G03F 9/00* (2006.01)
 - *G03F 7/00* (2006.01)
 - *G05B 19/4155* (2006.01)

(52) U.S. Cl.
 CPC .......... *G03F 9/7042* (2013.01); *G03F 7/0002* (2013.01); *G05B 19/4155* (2013.01); *G05B 2219/45028* (2013.01)

(58) Field of Classification Search
 CPC . G03F 9/7042; G03F 7/0002; G05B 19/4155; G05B 2219/45028
 See application file for complete search history.

(56) References Cited

U.S. PATENT DOCUMENTS

| | | | | |
|---|---|---|---|---|
| 2016/0320716 A1* | 11/2016 | Hosaka | ................. | G03F 7/0002 |
| 2017/0157810 A1* | 6/2017 | Kondo | ................. | G03F 7/0002 |
| 2020/0183270 A1* | 6/2020 | Okada | ................. | G03F 7/70783 |
| 2020/0409277 A1* | 12/2020 | Komaki | ................. | G03F 9/7042 |

FOREIGN PATENT DOCUMENTS

| | | |
|---|---|---|
| JP | 2020092178 A | 6/2020 |
| KR | 1020160129766 A | 11/2016 |
| KR | 1020200069224 A | 6/2020 |

OTHER PUBLICATIONS

Office Action issued in Korean Appln. No. 10-2023-0049118 mailed Jul. 18, 2025.

* cited by examiner

*Primary Examiner* — Xiao S Zhao
*Assistant Examiner* — Inja Song
(74) *Attorney, Agent, or Firm* — ROSSI, KIMMS & McDOWELL LLP

(57) ABSTRACT

A lithography device includes: a pattern forming unit that forms a pattern in a shot region on a substrate held by a substrate holding unit by using a pattern unit; an acquisition unit that acquires relationships among the amount of positional deviation of the substrate relative to the substrate holding unit, a holding force applied to at least a part of the substrate to hold the substrate, and an overlapping error between the substrate and the pattern unit; a measurement unit that measures the amount of positional deviation of the substrate relative to the substrate holding unit; and a control unit that controls the holding force to reduce the overlapping error between the substrate and the pattern unit on the basis of the amount of positional deviation measured by the measuring unit and the relationships acquired by the acquisition unit.

12 Claims, 7 Drawing Sheets

FIG. 6

|  | AMOUNT OF POSITIONAL DEVIATION OF SUBSTRATE | PRESSURE OF SUCTIONING SUBSTRATE | OVERLAPPING ERROR |
|---|---|---|---|
| CONDITION 1 | A1 | B1 | C1 |
| CONDITION 2 | A1 | B2 | C2 |
| CONDITION 3 | A1 | B3 | C3 |
| CONDITION 4 | A2 | B1 | C4 |
| CONDITION 5 | A2 | B2 | C5 |
| CONDITION 6 | A2 | B3 | C6 |
| CONDITION 7 | A3 | B1 | C7 |
| CONDITION 8 | A3 | B2 | C8 |
| CONDITION 9 | A3 | B3 | C9 |
| ⋮ | ⋮ | ⋮ | ⋮ |

LITHOGRAPHY DEVICE, LITHOGRAPHY METHOD, AND ARTICLE MANUFACTURING METHOD

BACKGROUND OF THE INVENTION

Field of the Invention

The present invention relates to a lithography device, a lithography method, an article manufacturing method, and the like.

Description of the Related Art

An imprint technology of transferring a pattern formed in a mold onto a substrate has attracted attention as a lithography technology used for manufacturing semiconductor devices. According to an imprint device using the imprint technology, an imprint material that is a curable composition placed on a substrate and a mold are brought into contact with each other, and the imprint material is cured in that state. Then, the mold is pulled out of the imprint material cured on the substrate, and a pattern in the mold is thereby transferred onto the substrate.

The imprint device is required to transfer the pattern in the mold onto the substrate with high precision. A technology of controlling a pressure of a substrate holding unit on the basis of substrate shape information or overlapping information in order to cause a pattern unit in a mold to overlap the position of a transfer region on a substrate with high precision is disclosed in Japanese Patent Laid-Open No. 2020-92178.

However, positional deviation may occur in the imprint device in the related art when the substrate is placed on the substrate holding unit. If positional deviation occurs, there is a problem that deformation of the substrate may change and an optimal value for overlapping precision may change.

Thus, one of objects of the present invention is to provide a lithography device capable of improving overlapping precision.

SUMMARY OF THE INVENTION

In order to achieve the object, a lithograph device according to an aspect of the present invention includes: at least one processor or circuit configured to function as a pattern forming unit configured to form a pattern in a shot region on a substrate held by a substrate holding unit by using a pattern unit, an acquisition unit configured to acquire relationships among an amount of positional deviation of the substrate relative to the substrate holding unit, a holding force applied to at least a part of the substrate to hold the substrate, and an overlapping error between the substrate and the pattern unit in advance, a measurement unit configured to measure the amount of positional deviation of the substrate relative to the substrate holding unit, and a control unit configured to control the holding force to reduce the overlapping error between the substrate and the pattern unit on the basis of the amount of positional deviation measured by the measurement unit and the relationships acquired by the acquisition unit.

Further features of the present invention will become apparent from the following description of embodiments with reference to the attached drawings.

BRIEF DESCRIPTION OF THE DRAWINGS

FIG. 6 is a diagram illustrating an example of a correction table acquired in Step S101 according to the first embodiment.

DESCRIPTION OF THE EMBODIMENTS

Hereinafter, with reference to the accompanying drawings, favorable modes of the present invention will be described using Embodiments. In each diagram, the same reference signs are applied to the same members or elements, and duplicate description will be omitted or simplified.

First Embodiment

First, an overview of an imprint device 1 serving as a lithography device according to a first embodiment will be described. The imprint device 1 is a molding device that forms a pattern of a cured article onto which an irregular pattern of a mold is transferred by bringing an imprint material that is a photocurable composition supplied to a substrate and the mold into contact with each other and applying energy for curing to the imprint material.

Figure 1:
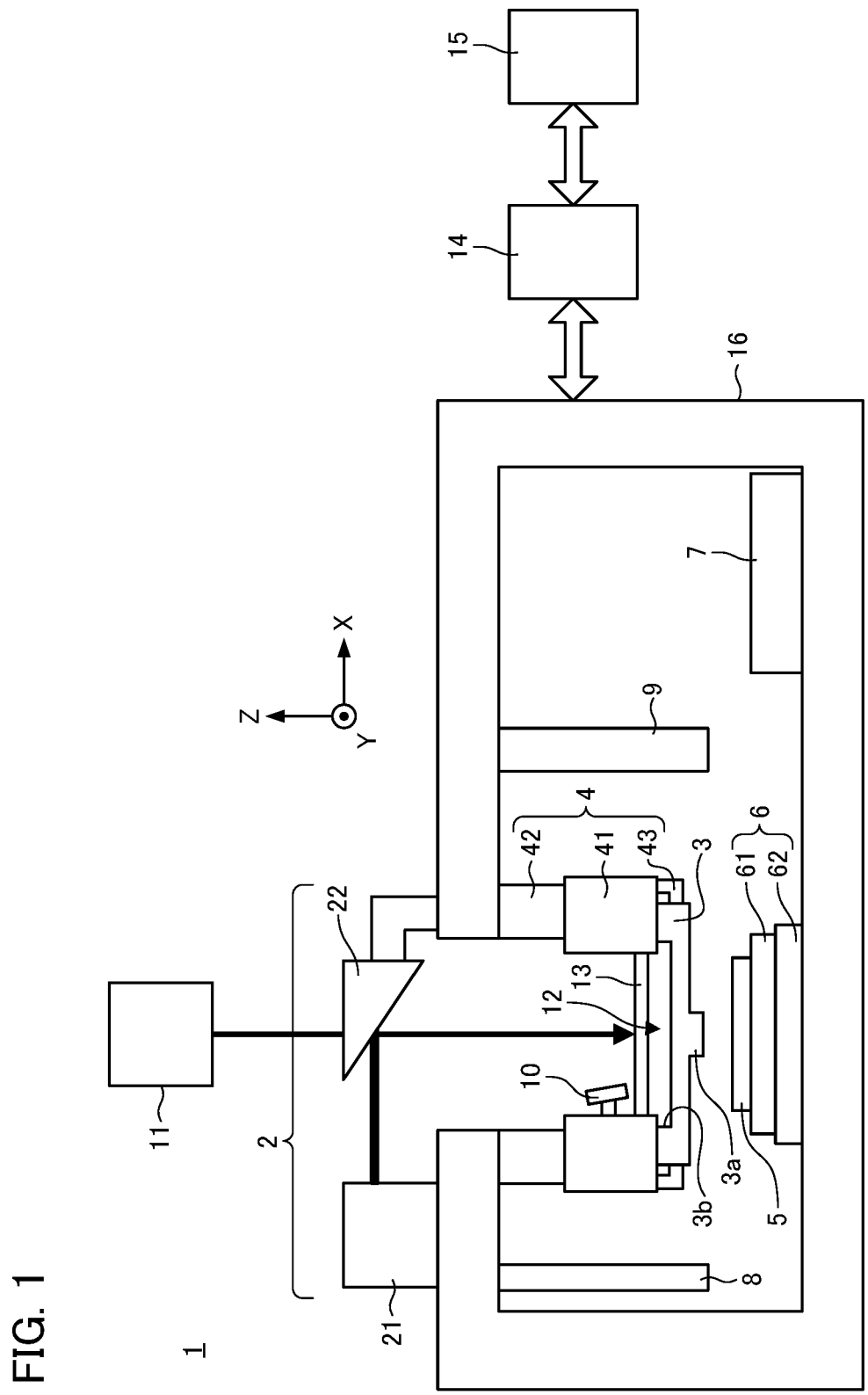
FIG. 1 is a diagram illustrating an imprint device according to a first embodiment of the present invention.

FIG. 1 is a diagram illustrating a configuration of the imprint device according to the first embodiment of the present invention. Although the imprint device 1 according to the present embodiment uses a photocuring method of curing the imprint material through irradiation with ultraviolet rays, a thermal curing method of curing the imprint material by applying heat, for example, may be used. Note that a Z axis in an XYZ coordinate system is set in a direction parallel with the axis of the irradiation of the mold with the ultraviolet rays and an X axis and a Y axis are set in directions that perpendicularly intersect each other in a plane that is perpendicular to the Z axis in each of the following drawings.

The imprint device 1 includes an irradiation unit 2, a mold stage 4 that holds a mold 3, a substrate stage 6 that holds a substrate 5, a pre-alignment unit 7, and an application unit 8 that supplies the imprint material. Also, the imprint device 1 includes an off-axis alignment measurement system 9, an alignment measurement system 10, a filling monitor 11, a control unit 14, and a console unit 15. The substrate stage 6 includes a substrate holding unit 61 that holds the substrate 5 and a substrate moving unit 62 that moves the substrate holding unit 61 (substrate 5) in the X direction and the Y direction.

The irradiation unit 2 includes a light source unit 21 that emits light to cure the imprint material on the substrate and an optical member 22 for guiding the light emitted from the light source unit 21 to the imprint material on the substrate, and the irradiation unit 2 irradiates the imprint material on the substrate with light via the transparent mold 3.

The optical member 22 includes an optical element for adjusting the light emitted from the light source unit 21 to light appropriate for imprint processing.

The mold 3 has a rectangular outer circumferential shape when seen from the Z direction and has a pattern unit 3a with three-dimensional irregularity on its surface facing the substrate 5. The material of the mold 3 is a material capable of transmitting the ultraviolet rays, such as quartz glass. Furthermore, the mold 3 can include a cavity (recessed portion) 3b for facilitating deformation of the pattern unit 3a.

The cavity 3b has a circular shape when seen from the Z direction, and the thickness of the lower portion of the cavity 3b is appropriately set depending on the shape and the material of the mold 3. Also, a light transmitting material 13 that has a space 12 surrounded by a part of an opening region in a mold stage 4, which will be described later, and the cavity 3b as a tightly closed space is placed in the opening region, and the pressure in the space 12 can be controlled by a pressure adjustment unit, which is not illustrated.

The mold stage 4 includes a mold holding unit 41 that holds the mold 3 with a vacuum suctioning force or an electrostatic force, a mold moving unit 42 that moves the mold holding unit 41 in the Z direction, and a mold deformation mechanism 43.

The mold holding unit 41 and the mold moving unit 42 have opening regions at the center portions (inside) thereof such that the imprint material on the substrate is irradiated with light from the irradiation unit 2.

The mold moving unit 42 includes, for example, an actuator such as a voice coil motor or an air cylinder.

The mold moving unit 42 causes the mold holding unit 41 (mold 3) to move in the Z direction to bring the pattern unit 3a into contact with the imprint material on the substrate or to pull the mold 3 away from the imprint material on the substrate.

The mold moving unit 42 may be configured to have a function of adjusting the position of the mold holding unit 41 not only in the Z direction but also in the X direction and the Y direction. Furthermore, the mold moving unit 42 may be configured to have a function of adjusting the position of the mold holding unit 41 in a θ (rotation around the Z axis) direction and a tilting function of adjusting an inclination of the mold holding unit 41.

The mold deformation mechanism 43 corrects the shape of the mold 3 (pattern unit 3a) by applying an external force or displacement to a side surface of the mold 3. The mold deformation mechanism 43 includes, for example, a plurality of actuators and is configured to pressurize each side surface of the mold 3 at a plurality of locations. The substrate 5 is, for example, a monocrystalline silicon substrate or a silicon-on-insulator (SOI) substrate.

Figure 2:
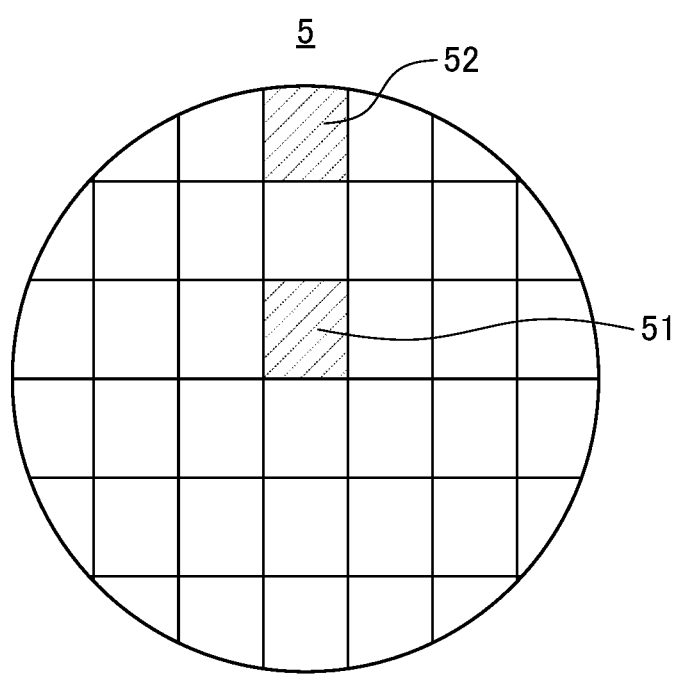
FIG. 2 is a diagram illustrating, as an example, a layout of a shot region on a substrate 5 according to the first embodiment.

FIG. 2 is a diagram illustrating, as an example, a layout of the shot region on the substrate 5 according to the first embodiment. Note that the shot region is a region where a pattern is formed in imprint processing performed once in the first embodiment. Also, a target shot region is a shot region that is a target on which the imprinting processing will be performed next.

The imprint device 1 performs the imprint processing every time the target shot region changes. The imprint processing includes at least a step of applying the imprint material to the target shot region, a step of bringing the pattern unit 3a and the imprint material into contact with each other, a step of filling the pattern unit 3a with the imprint material, and a step of curing the imprint material. Also, the imprint processing includes a step of pulling the cured imprint material and the mold 3 away from each other.

A plurality of shot regions are aligned in a matrix shape as illustrated in FIG. 2 on the substrate 5. In the first embodiment, the imprint processing is performed not only on the shot region 51 inside the substrate 5 but also on the peripheral shot region 52 including the outer periphery of the substrate 5 in order to maximize the effective area (the total area of the region onto which the pattern is transferred) on the substrate 5. The peripheral shot region is a shot region which is partially located outside the outer periphery of the substrate 5 and is also called a "missing shot region".

The pre-alignment unit 7 includes a pre-alignment stage for mounting the substrate 5 thereon, which is not illustrated, and a sensor for measuring the position of the substrate 5, which is not illustrated, detects the position of a notch or an orientation flat of the substrate 5 with the sensor, and measures the position of the substrate 5.

The pre-alignment stage performs correction drive on the basis of a measurement result, receives the substrate 5 from the outside with a substrate feeding hand, which is not illustrated, at a corrected position, and then places the substrate 5 on the substrate holding unit 61. Note that the receiving position of the substrate feeding hand or the position of the substrate holding unit 61 that receives the substrate 5 may be changed on the basis of the pre-alignment result.

Figure 3A:
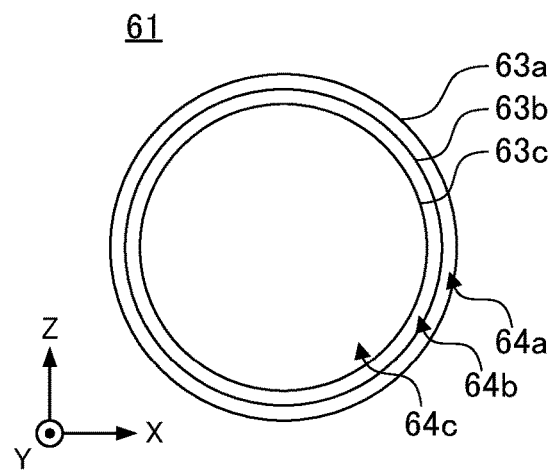
FIG. 3A is a plan view of a substrate holding unit 61 from the side of a mold 3.

FIG. 3A is a plan view of the substrate holding unit 61 seen from the side of the mold 3. As illustrated in FIG. 3A, a plurality of regions (pressurizing regions) 64a, 64b, and 64c partitioned by a plurality of partition walls 63a, 63b, and 63c are formed on the upper surface (the surface facing the rear surface of the substrate 5) of the substrate holding unit 61. In other words, the substrate holding unit 61 includes a plurality of pressurizing regions for pressurizing and holding the substrate. The plurality of pressurizing regions 64a, 64b, and 64c are coaxially partitioned, such that a positive pressure or a negative pressure can be independently applied to each of the pressurizing regions 64a, 64b, and 64c.

Figure 3B:
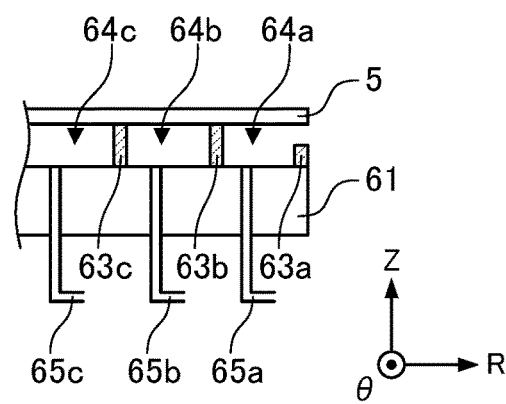
FIG. 3B is an XZ sectional view of the substrate holding unit 61 that holds the substrate 5.

Although the plurality of pressurizing regions 64a, 64b, and 64c are formed by providing the partition walls 63a, 63b, and 63c to stand on the upper surface of the substrate holding unit 61 in the example in FIG. 3A, they may be grooves formed by digging the upper surface of the substrate holding unit 61. FIG. 3B is an XZ sectional view of the substrate holding unit 61 that holds the substrate 5.

The pressurizing regions 64a, 64b, and 64c communicate with a pressure adjustment unit including a pressure application unit such as a pump, which is not illustrated, via pipes 65a, 65b, and 65c, respectively and can independently adjust the pressure in the closed spaces. It is possible to deform the substrate 5 in a curved manner in the Z direction by controlling each of the pressures in the closed spaces.

Figure 3C:
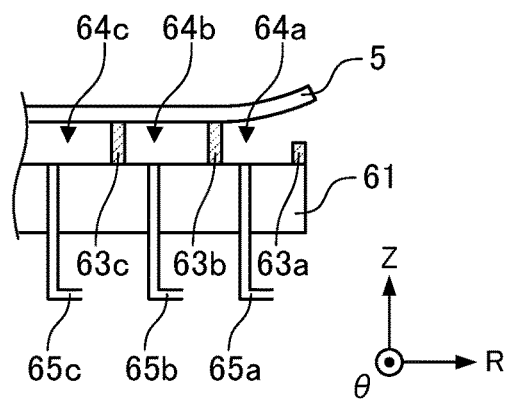
FIG. 3C is a diagram illustrating a state of deformation in a case where the pressure in a pressurizing region 64a is set to a positive pressure.

Particularly, it is possible to deform the part corresponding to the pressurizing region 64a for the substrate 5 downward toward the outer periphery side by setting the height of the partition wall 63a at the outermost periphery to be lower than the other plurality of partition walls located on the inner side thereof. FIG. 3C is a diagram illustrating a state of deformation in a case where the pressure in the pressurizing region 64a is set to a positive pressure and illustrates a state where the part corresponding to the pressurizing region 64a for the substrate 5 has been deformed upward toward the outer periphery side.

Figure 3D:
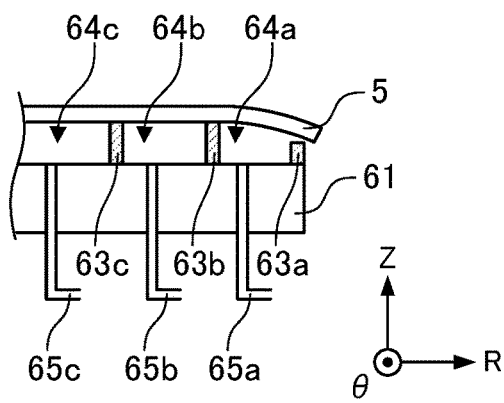
FIG. 3D is a diagram illustrating a state of deformation of the substrate 5 in a case where the pressure thereof is set to a negative pressure.

On the other hand, FIG. 3D is a diagram illustrating a state of deformation of the substrate 5 in a case where the pressure is set to a negative pressure and illustrates a state where the part corresponding to the pressurizing region 64a for the substrate 5 has been deformed upward toward the outer periphery side. Note that although the number of pressurizing regions of the substrate holding unit 61 is three, the number is not limited thereto and may be any number that is greater than one.

The substrate moving unit 62 in FIG. 1 may include, for example, a linear motor and may be configured of a plurality of drive systems such as a coarse drive system, a fine drive system, and the like. The substrate moving unit 62 may be configured to have a function of adjusting the position of the substrate holding unit 61 not only in the X direction and the Y direction but also in the Z direction. Furthermore, the substrate moving unit 62 may be configured to have a function of adjusting the position of the substrate holding unit 61 in the θ direction (rotation about the Z axis) and a tilt function of adjusting an inclination of the substrate holding unit 61.

For measurement of the position of the substrate stage 6, an encoder system configured of a scale provided at a casing 16 and a head (optical equipment) provided at the substrate moving unit 62, for example, is used. However, the measurement of the position of the substrate stage 6 is not limited to the encoder system, and an interferometer system configured of a laser interferometer provided at the casing 16 and a reflecting mirror provided at the substrate moving unit 62 may be used.

The off-axis alignment measurement system 9 and the alignment measurement system 10 performs prior alignment measurement in order to measure the relative positions of the mold 3 ad each shot in the substrate 5. The control unit 14 individually measures the positions of the substrate 5 and the mold 3 with reference to the device coordinates by using the off-axis alignment measurement system 9 and the alignment measurement system 10. The alignment measurement system 10 measures the position of the mold 3 with reference to the position of the alignment measurement system 10 by observing the mold-side mark.

On the other hand, the substrate holding unit 61 holding the substrate 5 moves to a location immediately between the off-axis alignment measurement system 9, and the off-axis alignment measurement system 9 measures a plurality of marks on the substrate 5. In this manner, the position of each shot in the substrate 5 is measured with reference to the substrate holding unit 61, and statistical processing (global alignment) for estimating the position coordinates of all the shot regions on the substrate 5 is performed.

The alignment measurement system 10 further measures the amounts of positional deviation of the alignment mark formed on the substrate 5 and the alignment mark formed on the mold 3 in each of the directions of the X axis and the Y axis. It is possible to adjust the position of the substrate stage 6 on the basis of the measured amounts of positional deviation.

The filling monitor 11 is a camera that observes a contact state between the imprint material supplied to the shot region on the substrate 5 and the pattern unit 3a. A failure location due to particles or non-filling is specified by observing the contact state between the pattern unit 3a and the substrate via the imprint material. The filling monitor 11 includes a light source, an imaging element, an optical system, and a processing unit (all of which are not illustrated). An LED or the like that emits light with a wavelength to which the imprint material is not sensitive is used as the light source of the filling monitor 11, and a CMOS image sensor or the like is used as the imaging element.

The optical system includes an illumination optical system that uniformly illuminates a region including the shot regions on the substrate 5 with light from the light source and an image forming optical system that optically conjugates the substrate 5 and the imaging element. The light emitted from the light source is transmitted through the optical member 22 disposed on the optical path of the ultraviolet rays, is then transmitted through the mold, and illuminates the shot regions.

Note that the imprint device 1 can measure the distance to the upper surface of the substrate 5 by a height measurement device, which is not illustrated. The height measurement device may be an external device such as an imprint device 1. In that case, data measured by the height measurement device as an external device may be stored in a memory and may be used by the imprint device 1.

The control unit 14 is configured of a computer including a CPU, a memory, and the like, for example, and comprehensively controls each part of the imprint device 1 in accordance with a computer program stored in the memory. The control unit 14 transfers the pattern unit 3a of the mold 3 onto the imprint material on the substrate by controlling the operation, adjustments, and the like of each part of the imprint device 1.

The console unit 15 is an interface that includes a computer including an input device such as a keyboard, a mouse, and the like and a display for sharing information between the imprint device 1 (control unit 14) and the user. The console unit 15 transmits (outputs) information regarding imprint processing input by the user to the control unit 14.

The information regarding the imprint processing input to the console unit 15 can be recorded as a recipe parameters or logs in the computer and can be checked before and after the imprint processing.

In the first embodiment, the console unit 15 also functions as a user interface for adjusting the pressures in the plurality of pressurizing regions 64a, 64b, and 64c. Also, the control unit 14 functions as an acquisition unit that acquires the pressures in the plurality of pressurizing regions 64a, 64b, and 64c input to the console unit 15 in the first embodiment.

Note that the control unit 14 may be configured integrally with (inside a common casing) the other parts of the imprint device 1 or may be configured as a separate body (inside another casing) from the other parts of the imprint device 1.

Here, a problem to be solved in the first embodiment will be described by using FIGS. 4A to 4F. Note that FIGS. 4A to 4F are diagrams for explaining relationships among the substrate position relative to the substrate holding unit, the pressure in the pressurizing region 64a, and the overlapping error.

When the substrate is disposed on the substrate holding unit by the substrate feeding hand on the basis of the substrate position measured by the pre-alignment unit 7, positional deviation may occur in accordance with position measurement precision of the pre-alignment unit 7. If positional deviation occurs, the position and the amount of deformation of the substrate may differ since the height of the partition wall at the outermost periphery of the substrate holding unit is lower than the other partition walls as illustrated in FIG. 3D.

Figure 4D:
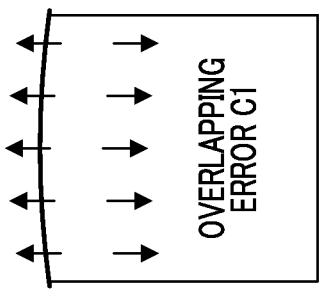
FIGS. 4A to 4F are diagrams for explaining relationships among the substrate position relative to the substrate holding unit, the pressure in the pressurizing region 64a, and an overlapping error.
Figure 4E:
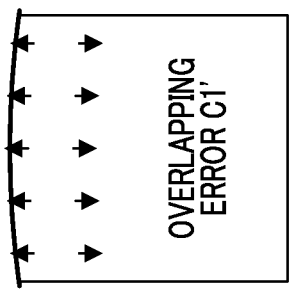
Figure 4F:
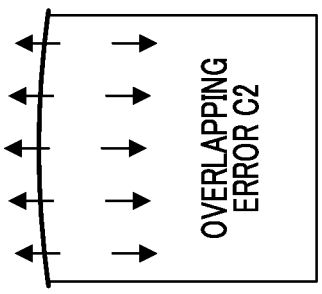
Figure 4A:
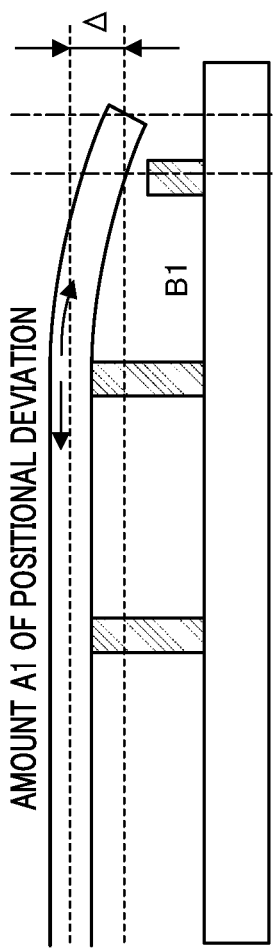

FIG. 4A is a sectional view illustrating a state where the pressure in the pressurizing region 64a is set to B1 in a state where the substrate is placed at an ideal center relative to the substrate holding unit. As illustrated in FIG. 4A, the amount A1 of positional deviation is achieved in the state where the substrate is placed at the ideal center relative to the substrate holding unit, and the pressure B1 in the pressurizing region 64a is set such that the overlapping error becomes an overlapping error C1 as a reference in this case.

In this case, warpage of the substrate has occurred by Δ relative to the neutral surface of the substrate. FIG. 4D is an enlarged view of the peripheral shot region 52 illustrated in FIG. 2 in the case of the state illustrated in FIG. 4A, and the substrate 5 is deformed in the arrow direction as illustrated in FIG. 4D, and the obtained overlapping error becomes C1.

Figure 4B:
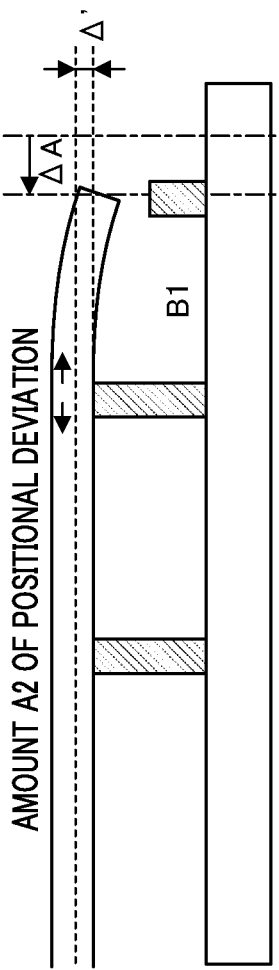

On the other hand, FIG. 4B is a sectional view illustrating a state where the pressure in the pressurizing region 64a is set to B1 in a state where the position of the substrate on the substrate holding unit has a deviation A2 by the amount ΔA. If the position of the substrate on the substrate holding unit has the deviation A2 by the amount AA as illustrated in FIG. 4B, and the same pressure as the pressure B1 in FIG. 4A is applied thereto, the amount of warpage becomes Δ', and the deformation of the substrate becomes small as illustrated in FIG. 4E.

Note that FIG. 4E is an enlarged view of the peripheral shot region 52 in the case of the state illustrated in FIG. 4B, and the overlapping error becomes C1' after a change from the overlapping error C1 as a reference illustrated in FIG. 4D. Even if the pressure on the substrate is determined in advance in accordance with the overlapping error and the bending of the substrate, the overlapping error may change due to the positional deviation of the substrate in this manner.

Thus, a correction table indicating relationships among the amount of positional deviation for each shot region, a pressure on the substrate, and the overlapping precision between the substrate and the mold is acquired in advance in the first embodiment. Then, the amount of positional deviation is obtained after the substrate supply step, and the pressure on the substrate is determined from the amount of positional deviation and the correction table. In this manner, it is possible to determine the pressure that minimizes the overlapping precision even in a case where there is a positional deviation of the substrate.

Figure 4C:
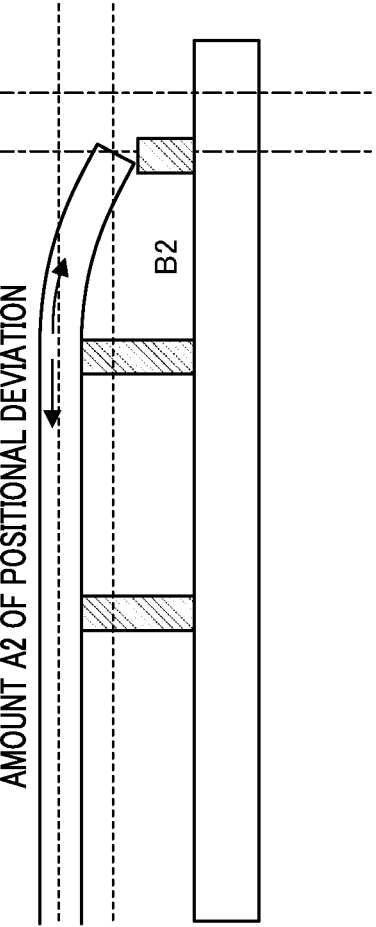

FIG. 4C is a sectional view illustrating a state where the pressure in the pressurizing region 64a is set to B2 in a state where the position of the substrate on the substrate holding unit has the deviation A2 by ΔA. Also, FIG. 4F is an enlarged view of the peripheral shot region 52 in the case of the state illustrated in FIG. 4C, in which the overlapping error C2 is substantially the same as the overlapping error C1 as a reference.

In other words, the pressure in the pressurizing region 64a is set to B2 such that deformation (warpage) of the substrate becomes the same as the state in FIGS. 4A and 4D even in the case where the position of the substrate relative to the substrate holding unit has a deviation by ΔA as illustrated in FIG. 4C. It is thus possible to curb a decrease in overlapping error.

Figure 5:
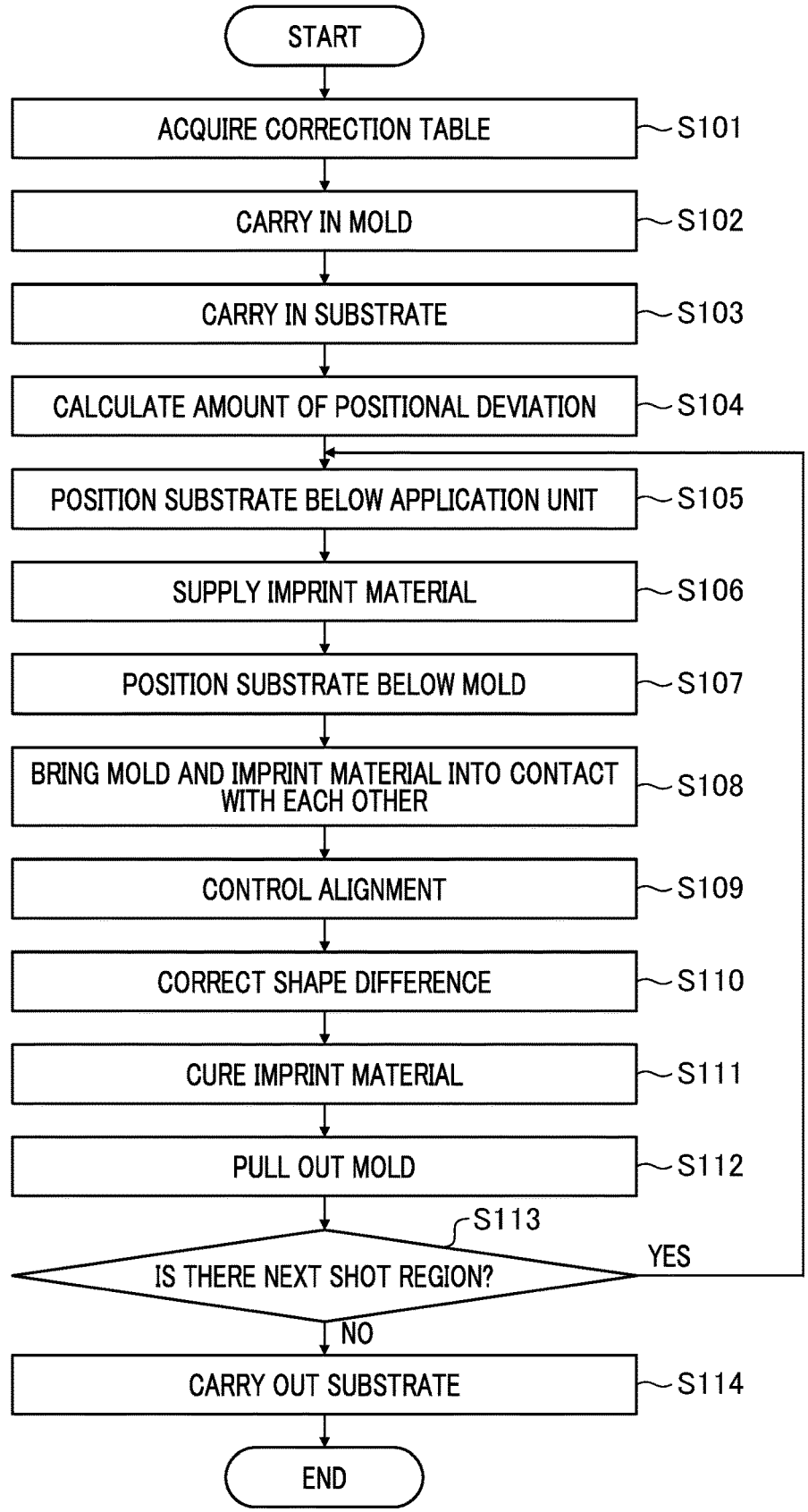
FIG. 5 is a flowchart for explaining imprint processing performed by the imprint device according to the first embodiment.

Next, FIG. 5 is a flowchart for explaining imprint processing performed by the imprint device according to the first embodiment, and the imprint processing performed by the imprint device 1 will be described with reference to FIG. 5. Note that operations in each step of the flowchart in FIG. 5 are performed by the computer in the control unit 14 executing the computer program stored in the memory.

In Step S101 in FIG. 5, the relationship among the amount of positional deviation of the substrate, the pressure on the substrate, and the overlapping error is measured in advance, and the correction table is acquired.

In Step S101, the position at which the substrate is fed to the substrate holding unit is changed on the basis of off-axis alignment measurement, a pressure on the substrate is changed at the position, and imprint is performed.

For example, the substrate is placed by setting the amount A1 of positional deviation of the substrate as a condition 1 first, and the pressure to the substrate is then set to the pressure B1, and imprint is performed. Substrates after the imprint are overlapped and measured, and the overlapping error C1 is acquired. The overlapping error acquired here is acquired by measuring the plurality of overlapping measurement marks disposed in the shot region. In other words, the overlapping error in the first embodiment is an overlapping error for each shot region.

Subsequently, the pressure is set to another pressure B2 as a second condition, imprint is performed, and the overlapping error C2 is acquired. In this manner, the relationships between the plurality of pressures and overlapping errors are acquired.

Next, the amount of positional deviation of the substrate is changed to A2, the substrate is placed again, the pressure is changed to a plurality of pressures similarly to the case of A1, imprint is performed under each of the pressures, and the relationships with the overlapping errors are acquired.

In this manner, a correction table based on the relationship of the amount of positional deviation of the substrate, the pressure on the substrate, and the overlapping error is acquired in Step S101.

FIG. 6 is a diagram illustrating an example of the correction table acquired in Step S101 according to the first embodiment. Note that although the correction table is described as being acquired on the basis of the experiments in the first embodiment, the correction table may be acquired through simulation. Note that the correction table may be commonly used by each imprint device, individual correction tables may be acquired in consideration of individual differences in flatness of chuck outer peripheries and differences in adsorption pressures.

Here, Step S101 functions as an acquisition step (acquisition unit) of acquiring relationships among the amount of positional deviation of the substrate with respect to the substrate holding unit, a holding force (pressure) to be applied to at least a part of the substrate to hold the substrate, and an overlapping error between the substrate and the pattern unit in advance.

In Step S102, the mold 3 is carried in the imprint device 1 in a case where the mold is changed. Specifically, the mold is 3 carried in (transported to) a part below the mold holding unit 41 in the imprint device 1 by a mold transporting mechanism (not illustrated), and the mold holding unit 41 is caused to hold the mold 3.

In Step S103, the substrate 5 is carried in the imprint device 1. The substrate 5 is disposed on the substrate holding unit 61 by the substrate feeding hand on the basis of the position where the substrate 5 is mounted, which is detected by the pre-alignment unit 7.

Step S104 is a step of acquiring the amount of positional deviation when the substrate is disposed on the substrate holding unit and functions as a measurement step (measurement unit) for measuring the amount of positional deviation of the substrate relative to the substrate holding unit. In the first embodiment, the amount of positional deviation of the substrate relative to the substrate holding unit is measured on the basis of the result obtained by the off-axis alignment measurement system 9 measuring the alignment mark disposed on the substrate.

A plurality of shot positions in the substrate 5 are measured with reference to the position of the substrate holding unit 61, and statistical processing (global alignment) for estimating the positional coordinates of all the shot regions on the substrate 5 is carried out. It is thus possible to acquire the amount of positional deviation of the substrate 5 relative to the substrate holding unit 61.

In Step S105, the substrate 5 is positioned below the application unit 8 (the supply position of the imprint material). Specifically, the substrate moving unit 62 causes the substrate holding unit 61 holding the substrate 5 to move such that the target shot region on the substrate 5 is located below the application unit 8. Then, in Step S106, the application unit 8 applies the imprint material to the target shot region on the substrate 5.

In Step S107, the substrate 5 is positioned below the mold 3. Specifically, the substrate moving unit 62 causes the substrate holding unit 61 holding the substrate 5 to move such that the target shot region on the substrate 5 with the imprint material supplied thereto is located below the pattern unit 3a of the mold 3.

In Step S108, the mold 3 and the imprint material on the substrate 5 are brought into contact with each other. In other words, the mold moving unit 42 causes the mold 3 to move in the −Z direction such that the pattern unit 3a of the mold 3 and the imprint material on the target shot region on the substrate 5 come into contact with each other.

In Step S109, the alignment measurement system 10 measures the positional deviation between the alignment mark formed on the substrate 5 and the alignment mark formed on the mold 3 in the X axis and Y axis directions. The substrate stage 6 is finely driven on the basis of the measured positional deviation to relatively position the mold 3 and the substrate 5.

In Step S110, a shape difference between the pattern unit 3a of the mold 3 and the target shot region on the substrate 5 is corrected. Also, the pressures in the pressurizing regions 64a, 64b, and 64c are changed such that the shape of the pattern unit 3a and the shape of the target shot region coincide with each other on the basis of the correction table acquired in Step S101 and the amount of positional deviation of the substrate acquired in Step S104.

Specifically, the amount of positional deviation measured in Step S04 is matched with the correction table acquired in Step S101, and the pressure that minimizes the overlapping error at the position is obtained as an optimal value. Also, the pressures in the pressurizing regions 64a, 64b, and 64c are adjusted to become the above optimal value in accordance with this. In other words, pressure adjustment is performed to minimize the overlapping error for each shot region.

Here, Step S110 functions as a control step (control unit) of controlling the holding force to reduce the overlapping error between the substrate and the pattern unit on the basis of the measured amount of positional deviation and the correction table acquired in Step S101.

Note that the overlapping error between the substrate and the pattern unit in the correction table is assumed to be the amount of warpage of the substrate outer periphery (measured by the sensor in the device), it is also possible to execute the processing in Step S101 before and after Step S104, for example. In that case, it is only necessary to perform correction to minimize the amount of warpage of the substrate outer periphery on the basis of the correction table in Step S110.

Note that the relationship among the amount of positional deviation of the substrate, the pressure on the substrate, and the overlapping error may be expressed as an approximate expression on the basis of the correction table, the pressure that minimizes the overlapping error may be calculated by using the approximate expression, and the calculated pressure may be used as a target value. In other words, the relationship among the amount of positional deviation of the substrate relative to the substrate holding unit, the holding force to be applied to at least a part of the substrate to hold the substrate, and the overlapping error between the substrate and the pattern unit may be acquired as an expression instead of the correction table in Step S101.

Note that in a case where the pressure (holding force) on the substrate is controlled to change the amount of deformation of the substrate, an alignment offset between the shot region and the pattern unit may also change. The alignment offset described here includes at least one of offsets of alignment, a magnification, rotation, skew, and a trapezoid, for example.

The alignment offset is an offset of positioning of the mold and the substrate in the XY directions, and the magnification offset is a relative contraction or expansion offset between the pattern unit of the mold and the shot region on the substrate. The rotation offset is a relative posture offset around the Z axis, and the skew offset is an offset of relative orthogonality between the pattern unit of the mold and the shot region on the substrate.

These alignment offsets are offsets generated due to differences between the alignment measurement system 10 and the optical system of the device that measures the overlapping precision (overlapping measurement device) and the like. Adjustment is typically performed to minimize the overlapping error by obtaining the alignment offset with reference to the overlapping measurement device, inputting the obtained offset to the console unit 15, and performing imprint.

In a case where the substrate is deformed in Step S110 on the basis of the amount of positional deviation of the substrate in Step S104, the alignment offset may also change. Therefore, an alignment offset between the shot region and the pattern unit is also corrected with the control of the pressure (holding force) in Step S110 in the first embodiment.

In other words, Step S110 also functions as a correction step (correction unit) of correcting the alignment offset between the shot region and the pattern unit.

How to obtain the amount of change in alignment offset will be described by using FIG. 4. As illustrated in FIG. 4A, the alignment offset has been adjusted with the amount A1 of positional deviation of the substrate and at the pressure B1, and the overlapping error is C1. On the other hand, in a case where the amount of positional deviation is A2, and the pressure is B2 as illustrated in FIG. 4C, the overlapping error is C2.

Therefore, a difference between C1 and C2 is calculated, and the alignment offsets (components such as alignment, a magnification, rotation, skew, a trapezoid, and the like) included in the difference are calculated, and each of them is added to the alignment offset that has already been input. In this manner, it is possible to perform imprint without degrading overlapping precision even in a case where the alignment offsets have been changed in response to correction of the amount of deformation of the substrate due to the pressure on the substrate.

In Step S111, the pattern is formed in the shot region by curing the imprint material in a state where the mold 3 and the imprint material applied to the shot region on the substrate are brought into contact with each other. Specifically, the imprint material is cured by the irradiation unit 2 irradiating the imprint material with which the pattern unit 3*a* of the mold 3 is brought into contact with light.

In Step S112, the mold 3 is pulled out of the cured imprint material on the substrate. Specifically, the mold moving unit 42 causes the mold 3 to move in the +Z direction such that the mold 3 is peeled off from the imprint material on the substrate, that is, such that the distance between the mold 3 and the substrate 5 increases.

In Step S113, presence/absence of the target shot region on which a pattern is to be formed is subsequently determined. In a case where it is determined that there is no target shot region (NO in Step S113), the substrate transport mechanism (not illustrated) carries out the substrate from the imprint device 1 in Step S114. In a case where it is determined that there is a target shot region (YES in Step S113), Steps S105 to S113 are repeated.

Here, Steps S105 to S113 function as a pattern forming step (pattern forming unit) of forming the pattern by using the pattern unit 3*a* in the shot region on the substrate 5 held by the substrate holding unit 61.

Note that although the pressurizing regions of the substrate holding unit 61 are concentrically split to correct distortion of the substrate 5 in the radial direction, the splitting shape is not limited thereto. In a case where distortion in the circumferential direction of the substrate 5 is large, for example, the partition walls of the substrate holding unit may be radially disposed, and the pressurizing regions may be split in the circumferential direction.

Alternatively, radially disposed partition walls and concentrically disposed partition walls may be combined to split the pressurizing regions, and the pressurizing regions of the substrate holding unit 61 may include regions sectioned into a lattice shape. Also, although the peripheral shot region that is more likely to be deformed has been described as an example in the first embodiment, the present invention is not limited thereto, and similar correction may be performed on the shot region on the inner side of the substrate 5 as a target.

As described above, it is possible to correct the shape difference between the pattern unit 3*a* and the shot region on the substrate 5 by controlling the pressures in the pressurizing regions of the substrate holding unit 61 in accordance with the amount of positional deviation of the substrate in the state where the pattern unit 3*a* and the imprint material on the substrate are brought into contact with each other, for example, in the first embodiment. It is thus possible to improve the overlapping precision.

Second Embodiment

Figure 7:
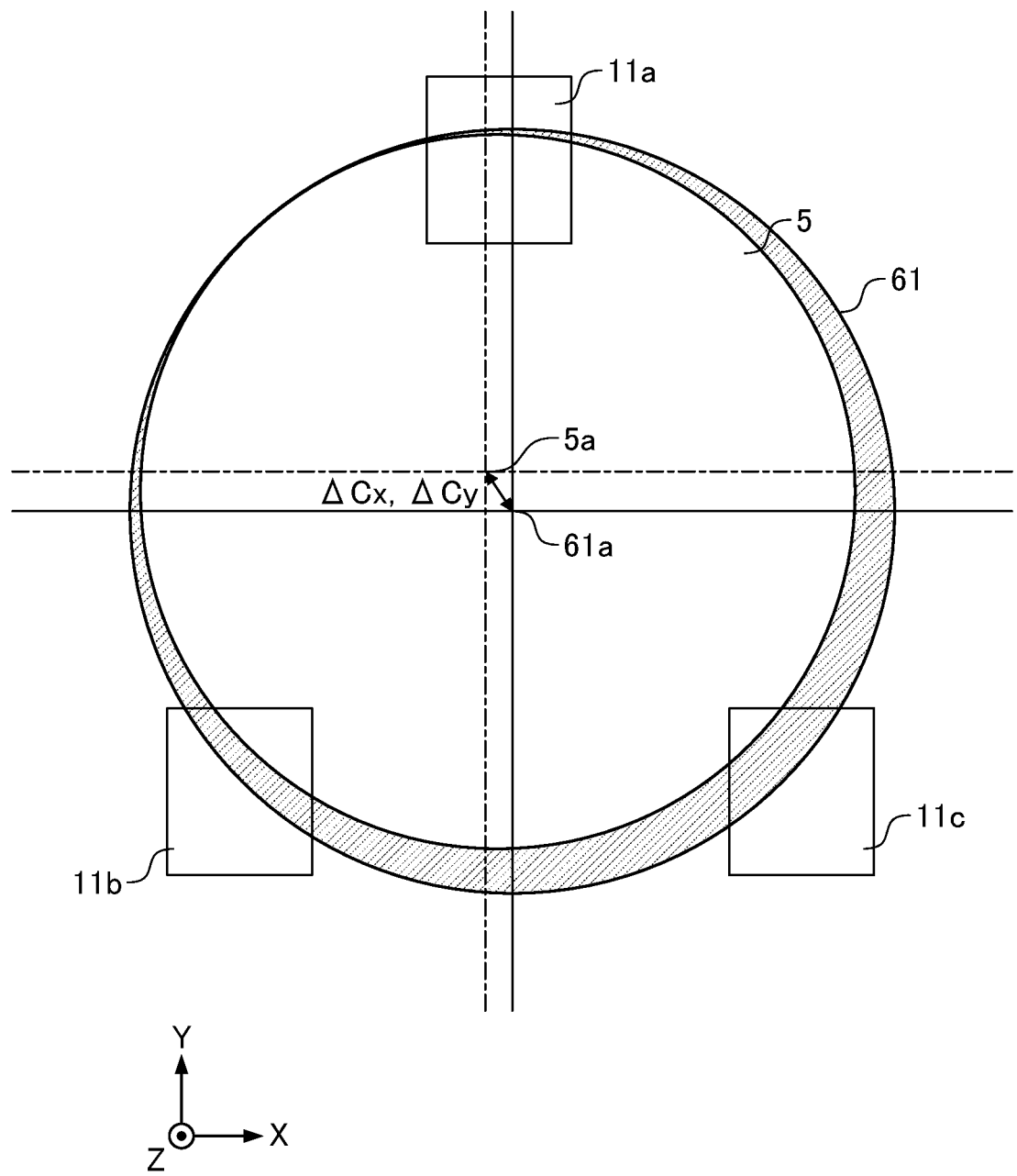
FIG. 7 is a diagram for explaining a method for measuring substrate positional deviation according to a second embodiment of the present invention.

FIG. 7 is a diagram for explaining a method for measuring positional deviation of a substrate according to a second embodiment of the present invention, and the second embodiment of the present invention will be described on the basis of FIG. 7.

In the first embodiment, the example in which the amount of positional deviation of the substrate relative to the substrate holding unit is calculated on the basis of the result obtained by off-axis alignment measurement system 9 measuring the alignment mark disposed on the substrate and by performing statistical processing. In the second embodiment, the filling monitor 11 is used to calculate relative positional deviation between the substrate 5 and the substrate holding unit. Note that since an imprint device and operations of imprint processing in the second embodiment are the same as those in the first embodiment, only different items will be described.

FIG. 7 illustrates a state of the substrate 5 placed on the substrate holding unit 61 seen from the +Z direction, and in Step S104, the substrate moving unit 62 moves the substrate holding unit 61 holding the substrate 5 such that the substrate holding unit 61 is located below the filling monitor 11. Then, the substrate moving unit 62 is moved to reach an observation field-of-view 11*a* of the filling monitor 11.

Each of the center 5*a* of the substrate 5 and the center 61*a* of the substrate holding unit 61 are calculated from the image acquired at this time, and the amount of positional deviation ($\Delta$Cx, $\Delta$Cy) is calculated. In regard to the calculation of the centers, it is possible to obtain them as centers of circles by detecting, in image processing, edges of the substrate 5 and the substrate holding unit 61 in the acquired observation field-of-view 11*a*, for example. Note that if an outline tolerance of the substrate 5 and a manufacturing error of the substrate holding unit 61 are taken into consideration, it is desirable to acquire images of a plurality of locations, such as an observation field-of-view 11*b* and an observation field-of-view 11*c*, with the filling monitor 11 and to calculate the centers.

The pressures in the pressurizing regions 64*a*, 64*b*, and 64*c* are changed in Step S110 on the basis of the thus acquired amount of positional deviation and the correction table acquired in Step S101, and the shape difference between the pattern unit 3*a* of the mold 3 and the target shot region on the substrate 5 is corrected. Therefore, it is possible to detect the amount of positional deviation with higher precision and to further improve overlapping precision in the second embodiment.

Note that the lithography device according to the above embodiments includes an exposure device that irradiates the pattern unit of reticle (a mask or an original plate) or the like with a pattern formed thereon with light and projects the pattern to a shot region on a wafer with the light from the reticle. Also, the lithography device according to the above embodiments is included as a part of a lithography system.

Also, the lithography system includes a step of developing a substrate (a wafer, a glass substrate, or the like) with a pattern formed thereon by the lithography device according to the above embodiments, and the lithography system can manufacture an article by processing the developed substrate in other known steps. Note that other known steps include etching, resist peeling, dicing, bonding, packaging, and the like.

According to the article manufacturing method using the lithography device in the embodiments as described above, it is possible to reduce an overlapping error as compared with the related art and thereby to manufacture an article with high quality.

While the present invention has been described with reference to exemplary embodiments, it is to be understood that the invention is not limited to the disclosed exemplary embodiments. The scope of the following claims is to be accorded the broadest interpretation to encompass all such modifications and equivalent structures and functions.

In addition, as a part or the whole of the control according to the embodiments, a computer program realizing the function of the embodiments described above may be supplied to the lithography device through a network or various storage media. Then, a computer (or a CPU, an MPU, or the like) of the lithography device may be configured to read and execute the program. In such a case, the program and the storage medium storing the program configure the present invention.

This application claims the benefit of Japanese Patent Application No. 2022-072974, filed on Apr. 27, 2022, which is hereby incorporated by reference herein in its entirety.

What is claimed is:

1. A lithography device comprising:
a pattern forming unit configured to form a pattern in a shot region on a substrate held by a substrate holding unit by using a pattern unit of a mold,
an acquisition unit configured to acquire relationships among an amount of positional deviation of the substrate relative to the substrate holding unit, a holding force applied to at least a part of the substrate to hold the substrate, and an overlapping error between the substrate and the pattern unit,
a first measurement unit configured to measure the amount of positional deviation of the substrate relative to the substrate holding unit,
a second measurement unit configured to measure an amount of positional deviation of the substrate relative to the mold,
a substrate moving unit configured to move the substrate holding unit; and
a control unit configured to control the holding force applied to at least the part of the substrate to hold the substrate to reduce the overlapping error between the substrate and the pattern unit on the basis of the amount of positional deviation measured by the first measurement unit and the relationships acquired by the acquisition unit;
wherein the control unit is configured to control a position of the substrate holding unit by using the substrate moving unit based on the amount of positional deviation of the substrate relative to the mold measured by the second measurement unit.

2. The lithography device according to claim 1, wherein the overlapping error between the substrate and the pattern unit is an overlapping error for each shot region.

3. The lithography device according to claim 2, wherein the control unit controls the holding force to reduce the overlapping error for each shot region.

4. The lithography device according to claim 1, wherein the substrate holding unit includes a plurality of pressurizing regions to pressurize and hold the substrate, and the control unit is configured to control pressures in the plurality of pressurizing regions based on the amount of positional deviation of the substrate relative to the substrate holding unit.

5. The lithography device according to claim 4, wherein the plurality of pressurizing regions is concentrically partitioned, and the height of an outermost partition wall from among partition walls partitioning the plurality of pressurizing regions is configured to be lower than the heights of the other partition walls.

6. The lithography device according to claim 4, wherein the plurality of pressurizing regions includes regions partitioned in a grid shape.

7. The lithography device according to claim 4, wherein the control unit is configured to control the pressures in the plurality of pressurizing regions in a state where the pattern unit and the imprint material on the substrate are brought into contact with each other.

8. The lithography device according to claim 1, wherein the pattern forming unit forms the pattern in the shot region by curing an imprint material applied to the shot region on the substrate in a state where the imprint material and the mold are brought into contact with each other.

9. The lithography device according to claim 1, wherein the first measurement unit is an off-axis alignment measurement system.

10. The lithography device according to claim 1, further comprising a correction unit, wherein the correction unit corrects an alignment offset between the shot region and the pattern unit with the control of the holding force applied by the control unit.

11. The lithography device according to claim 1, wherein the control unit is configured to control the holding force so that an amount of warpage of an outer periphery of the substrate is reduced.

12. The lithography device according to claim 1, wherein the first measuring unit is configured to measure a position of the substrate before measuring the amount of positional deviation of the substrate relative to the substrate holding unit.

* * * * *